(12) United States Patent
Orbay et al.

(10) Patent No.: US 12,030,404 B2
(45) Date of Patent: Jul. 9, 2024

(54) MONITORING SYSTEM FOR AN ENERGY STORAGE SYSTEM

(71) Applicant: Volvo Car Corporation, Gothenburg (SE)

(72) Inventors: Raik Orbay, Gothenburg (SE); Inko Marcaide, Gothenburg (SE)

(73) Assignee: VOLVO CAR CORPORATION, Gothenburg (SE)

( * ) Notice: Subject to any disclaimer, the term of this patent is extended or adjusted under 35 U.S.C. 154(b) by 65 days.

(21) Appl. No.: 17/818,200

(22) Filed: Aug. 8, 2022

(65) Prior Publication Data

US 2023/0048752 A1 Feb. 16, 2023

(30) Foreign Application Priority Data

Aug. 10, 2021 (EP) ..................................... 21190589

(51) Int. Cl.
*B60L 58/16* (2019.01)
*B60L 58/18* (2019.01)
(Continued)

(52) U.S. Cl.
CPC ............... *B60L 58/16* (2019.02); *B60L 58/18* (2019.02); *G01K 3/005* (2013.01); *G01R 31/392* (2019.01);
(Continued)

(58) Field of Classification Search
CPC .... B60L 58/16; B60L 58/18; B60L 2240/545; G01R 31/392; H02J 7/00032; H02J 7/005; H02J 7/0013; H02J 7/00; H01M 50/209; H01M 50/211; H01M 50/213; H01M 10/425; H01M 10/482; H01M 10/486; H01M 2010/4271; H01M 2010/4278;
(Continued)

(56) References Cited

U.S. PATENT DOCUMENTS

2017/0324122 A1* 11/2017 Poirier .................. H01M 50/44

FOREIGN PATENT DOCUMENTS

EP          1856760 B1      3/2010
KR    2008 0109121 A      12/2008
(Continued)

OTHER PUBLICATIONS

Extended EP Search Report for EP Application No. 21190589.8 dated Feb. 8, 2022.

*Primary Examiner* — Robert L Deberadinis
(74) *Attorney, Agent, or Firm* — Amin, Turocy & Watson, LLP

(57) ABSTRACT

The present disclosure relates to a monitoring system for an energy storage system, an energy storage system comprising such a monitoring system, a vehicle comprising such an energy storage system and a manufacturing method for such a monitoring system. The monitoring system for an energy storage system comprises a plurality of energy storage cells comprising at least one stretchable electronic unit and a communication element. The stretchable electronic unit is arrangeable at least at one of the energy storage cells. The stretchable electronic unit is configured to generate data based on strain applied on the stretchable electronic unit. The communication element is integrated in the stretchable electronic unit and configured to transfer data generated by the stretchable electronic unit.

20 Claims, 1 Drawing Sheet

(51) Int. Cl.
  *G01K 3/00* (2006.01)
  *G01R 31/392* (2019.01)
  *H01M 10/42* (2006.01)
  *H01M 10/48* (2006.01)
  *H01M 50/209* (2021.01)
  *H01M 50/211* (2021.01)
  *H01M 50/213* (2021.01)
  *H02J 7/00* (2006.01)
  *G07C 5/00* (2006.01)

(52) U.S. Cl.
  CPC ....... *H01M 10/425* (2013.01); *H01M 10/482* (2013.01); *H01M 10/486* (2013.01); *H01M 50/209* (2021.01); *H01M 50/211* (2021.01); *H01M 50/213* (2021.01); *H02J 7/00032* (2020.01); *H02J 7/0013* (2013.01); *H02J 7/005* (2020.01); *B60L 2240/545* (2013.01); *G07C 5/008* (2013.01); *H01M 2010/4271* (2013.01); *H01M 2010/4278* (2013.01); *H01M 2220/20* (2013.01)

(58) Field of Classification Search
  CPC .. H01M 2220/20; H01M 5/209; H01M 10/42; H01M 10/48; G01K 3/005; G01K 3/00; G07C 5/008; G07C 5/00
  See application file for complete search history.

(56) References Cited

FOREIGN PATENT DOCUMENTS

| | | |
|---|---|---|
| WO | 0235618 A1 | 5/2002 |
| WO | 2020242476 A1 | 12/2020 |

\* cited by examiner

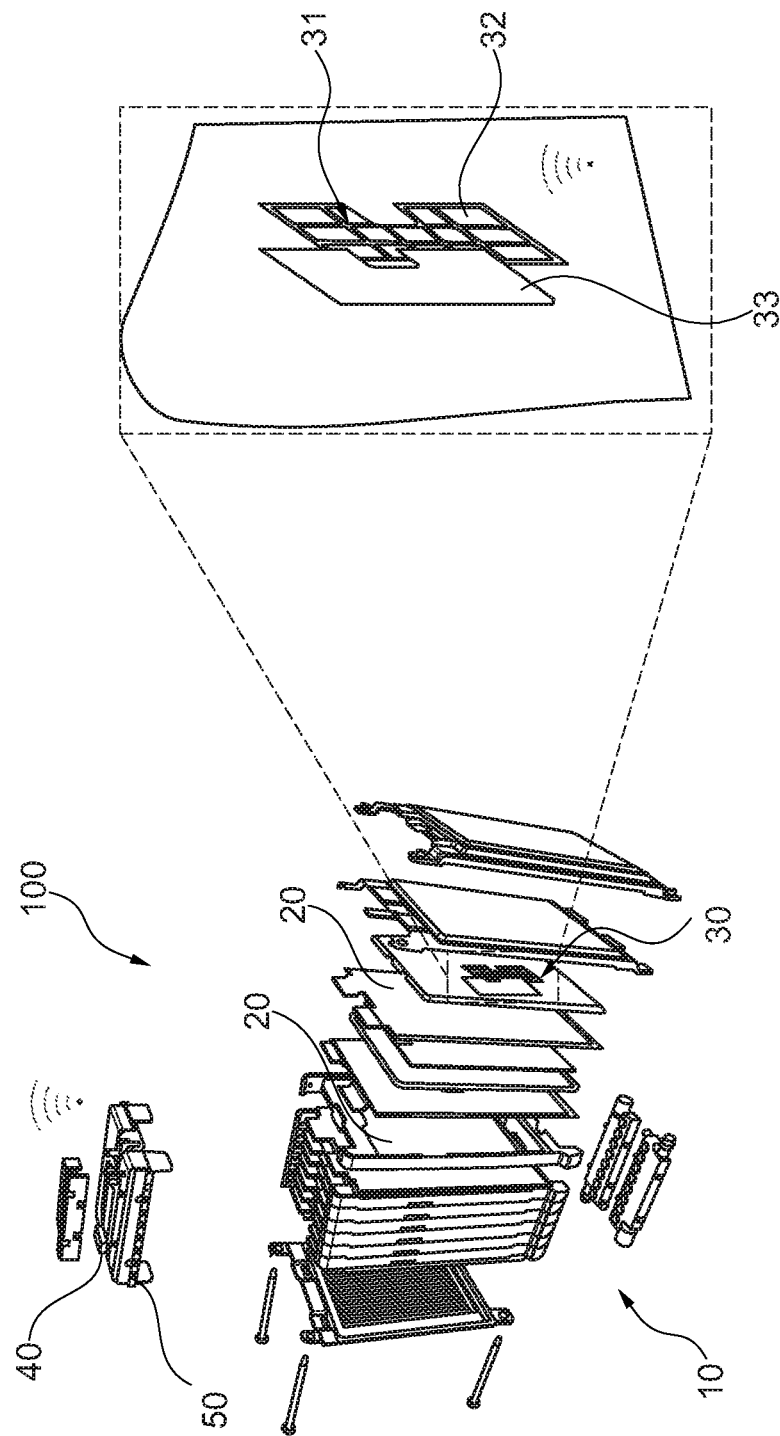

MONITORING SYSTEM FOR AN ENERGY STORAGE SYSTEM

TECHNICAL FIELD

The present disclosure relates to a monitoring system for an energy storage system, an energy storage system comprising such a monitoring system, a vehicle comprising such an energy storage system and a manufacturing method for such a monitoring system.

BACKGROUND ART

Battery-powered vehicles, such as electric vehicles or hybrid electric vehicles comprise a battery system supplying high voltage energy for operating an electric motor to propel the vehicle. The battery system may comprise a plurality of battery cells connected in series or parallel. For a safe operation and a reliable power and a State of Health (SOH) estimation, the battery system may be associated with a battery management system (BMS). The BMS is an electronic system, which constantly monitors parameters associated with the battery system and battery cells such as a state of charge and/or state of health.

A rechargeable battery system comprising a plurality of cells, ages over time and degrades in capacity over time. During utilization, the rechargeable high voltage batteries suffer thermal stresses due to the exothermic reactions. Often, excessive temperatures cause the high voltage batteries to swell. Swelling of the rechargeable batteries may also occur if the batteries are deep discharged. Additionally, batteries with solid state ingredients swell and breathe during operation. Hence, the BMS monitors the battery system and collects data of the battery system to avoid risky situations and optimize performance of the battery system.

SUMMARY

Hence, there may be a need to provide an improved monitoring system for an energy storage system, which may precisely monitor mechanical, thermal and/or chemical stress exerted on energy storage cells arranged in the energy storage system.

The problem is solved by the subject matters of the independent claims of the present disclosure, wherein further embodiments are incorporated in the dependent claims. It should be noted that the aspects of the disclosure described in the following apply to the monitoring system for an energy storage system, the energy storage system comprising such a monitoring system, the vehicle comprising such an energy storage system and the manufacturing method for such a monitoring system.

According to the present disclosure, a monitoring system for an energy storage system is presented. The monitoring system for an energy storage system comprising a plurality of energy storage cells comprises at least one stretchable electronic unit comprising a communication element. The stretchable electronic unit is arrangeable at least at one of the energy storage cells. The stretchable electronic unit is configured to generate data based on strain applied on the stretchable electronic unit. The communication element is integrated in the stretchable electronic unit and configured to transfer data generated by the stretchable electronic unit.

The monitoring system according to the present disclosure allows a real-time monitoring of the battery aging, mechanical and thermal stresses acting on the energy storage system; thus avoiding related hazards or malfunctions of the energy storage system. In particular, the soft, conformable, stretchable electronic unit may detect deformation of the energy storage system with great precision, which may allow estimating a usage profile of the energy storage system and a condition-monitoring. Further, the stretchable electronic unit may utilize an internet of things (IoT) technology by means of the communication element, which allows a remote monitoring and/or controlling of a state of the energy storage system. Accordingly, the energy storage system may be manufactured compactly, thus packaging-efficiently.

A state of health (SoH) detection may be realized via a low-power system-on-chip technology (SoC) on a stretchable substrate, where a need to send data and communicate with other equipment during the data acquisition phase can be eliminated/minimized. The SoC with Internet of Things (IoT) ability may be integrated on a soft, conformable, stretchable electronic device for applications in batteries.

The energy storage system may be configured for storing and providing energy. The energy storage system may comprise one or more energy storage modules. Each energy storage module may comprise a plurality of rechargeable energy storage cells, which may be electrically connected in series or parallel. Alternatively, the energy storage modules may comprise a plurality of non-rechargeable energy storage cells, which may be electrically connected in series or parallel. Further, the energy storage cells may comprise a solid state anode, cathode and/or electrolyte.

The energy storage cells may be arranged next to each other. Each energy storage cell may be surrounded by an individual frame element or comprise an integrated fastening element, i.e. self-bearing battery to arrange the energy storage cells next to each other. The energy storage cells may be directly stacked on top of each other. Alternatively, the energy storage cells may be arranged in series or spaced apart from each other such that between the energy storage cells a gap may be provided.

The stretchable electronic unit may be arranged at one or more the energy storage cells. The term "stretchable" may be understood that the stretchable electronic unit may be expanded without failing when a pressure force and/or a strain is applied but recover its original size, function and form when the pressure force is removed. The stretchable electronic unit may comprise a circuit capable of measuring strain or pressure force exerted thereon, as well as the history of magnitudes for instance by applying a microprocessor with metal-oxide thin-film transistor technology on a flexible substrate positioned on a conducting fabric.

The soft, conformable, stretchable electronic unit on flexible substrate may be configured to generate data based on mechanical pressure, or strain applied on the stretchable electronic unit. The stretchable electronic unit may comprise a flexible electronic element, which may be exceedingly sensitive. Thus, the stretchable electronic unit may be able to measure even a small change of force exerted on its surface or pressure distribution caused by deformation of the energy storage system and/or the energy storage cells. Accordingly, any random/systematic shape change of the energy storage cells and/or the energy storage system may be detected and logged by the stretchable electronic unit.

In an example, the stretchable electronic unit may be configured to monitor swelling, contraction and/or breathing of the energy storage system. The soft, conformable, stretchable electronic unit may be compressible or extensible in all directions. Accordingly, the stretchable electronic unit may detect any deformation such as swelling and/or contraction of the energy storage system or energy storage cells.

The stretchable electronic unit may be directly arranged at a surface of one of the energy storage cell. Alternatively, the stretchable electronic unit may be arranged between the energy storage cells and an inner surface of a housing of the energy storage system such that the stretchable electronic unit may face the surface of the energy storage cell. Alternatively, the stretchable electronic unit may be arranged on the tabs of the energy storage cell. Alternatively the stretchable electronic unit may be arranged in the immediate vicinity of the cell on a structural element. The monitoring system may also comprise several stretchable electronic units, which may be arranged at least at one surface of several energy storage cells and/or distributed on the nearby structural elements. The stretchable electronic unit(s) may be arranged at least at one lateral side of the energy storage system, which may be parallel and/or perpendicular relative to a stacked direction of the energy storage cells. Additionally or alternatively, the stretchable electronic unit(s) may be arranged at a top side and/or bottom side of the energy storage system, in a cell, a module or a system level accommodation means freely as required by the design.

The communication element may be configured to send and/or receive data generated by the stretchable electronic unit. Thus, the communication element may be coupled with a processing unit and/or a control unit of the energy storage system to transfer data for evaluating the generated data. In other words, the processing unit and/or the control unit may not be directly arranged at the energy storage cells and/or the energy storage unit, since the communication element integrated in the stretchable electronic unit may communicate remotely.

The communication element may utilize a long range communication element such as LTE, 5G, or a short range communication element such as Wi-Fi, Bluetooth, NFC, etc. Accordingly, the energy storage system may be monitored in real-time and manufactured compactly. The communication element may be included in soft, conformable, stretchable electronic unit or may be designed as a separate sub-unit appropriate for packaging in vehicle.

In an example, several stretchable electronic units can be coupled to one wireless communication unit, or several wireless units can be coupled to one soft, conformable, stretchable unit for redundancy. One soft, conformable, stretchable unit may also be designed in data connection with two different communication means; e.g., LTE and Bluetooth. Alternatively, the stretchable electronic unit may comprise a built-in processor configured to parse acquisitioned data to discern any changes in state of health (SOH) of the energy storage system without external wireless/wired interaction.

In an example, the monitoring system may comprise a data storage unit for receiving and storing data generated by the stretchable electronic unit. The data storage unit may be directly and locally integrated in the soft, conformable, stretchable electronic unit. Alternatively, the data storage unit may be arranged externally such that data may be sent from the stretchable electronic unit to the data storage unit by means of the communication element. The data storage unit may communicate with the processing unit and/or the control unit via the communication element as well.

In an example, the stretchable electronic unit comprises a conductive material and a stretchable sheet or a conductive fabric. The conductive material is printed on the stretchable sheet. Accordingly, the soft, conformable, stretchable electronic unit may form a system-on-film. The stretchable sheet may be formed as a very thin layer and comprise elastic and stretchable materials such as silicone, polyurethane, polyethylene, poly(ethylene-vinyl acetate), polyvinyl chloride, polyimide substrates, polyborodimethylsiloxane, polystyrene, acrylonitrile-butadiene-styrene, styrene-butadienestyrene, ethylene propylene rubber, thermoplastic elastomeric gel, conductive polymers, etc., as well as hybrid solutions using the above materials and even appropriate fabrics manufactured thereof.

The conductive material may be selected from the group consisting of carbon, conducting metal family of the periodic table, oxides, sulfides, conductive polymers. The conductive material may be printed on the thin stretchable layer to form a compact but flexible conductive fabric for the stretchable electronic unit. Alternatively, the conductive material may be also attached to the stretchable sheet or a conducting fabric. The stretchable electronic unit may be configured to measure a distance change of the conductive material integrated in the stretchable sheet according to deformation of the stretchable sheet due to the strain or pressure force exerted on the stretchable sheet.

In an example, the stretchable electronic unit may be configured to detect the deformation of the energy storage system by measuring a capacitance or conductance change of the conductive material.

The stretchable electronic unit may be able to detect not only the deformation of the energy storage system with respect to pressure force but also acceleration, position, temperature, inductance, chemical concentration, humidity, etc. of different kinds of materials in a contactless and/or wear-free manner. Moreover, such stretchable electronic unit may have an ability to detect up to a large distance with a small size.

In an example, the stretchable electronic unit is attachable at the surface of the one of the energy storage cells. In other words, the stretchable electronic unit may be fixed directly at the surface of the energy storage cell, for instance by adhering, to detect the deformation of the respective energy storage cell by precisely measuring strain and/or stress applied on the stretchable electronic unit.

In an example, the monitoring system further comprises a processing element. The processing element is connected to the stretchable electronic unit and configured to parse data generated by the stretchable electronic unit. The processing element may be configured to receive data from the stretchable electronic unit via the communication element. Accordingly, the processing element may be arranged outside the energy storage system independently of an arrangement of the energy storage cells. Based on the obtained data, the processing element may analyse, for instance a deformation degree of the energy storage cells and/or the energy storage module.

In an example, the processing element may be embedded in the soft, conformable, stretchable electronic unit as an SoC (system on chip) processing element. Advantageously, in-built SoC processing ability of the stretchable electronic unit may enable an implementation of model-based secondary magnitudes starting from primarily detected magnitudes as strain and/or stress, temperature, chemical concentration, capacitance, inductance, magnetic or electric field changes. For instance, the temperature detected on a soft, conformable, flexible circuit on the energy storage cell can easily be connected to the temperature of the same energy storage cell core using a model based on Fourier's Law of Thermal Conduction.

The SoC based stretchable electronic unit may further allow for extensions of the detection capability, e.g., extra models could help in detection errors on BMS, electric motor, or PWM control. This can be achieved by means of additional models making use of primary detection magnitudes.

In an example, the stretchable electronic unit is stretchable omnidirectionally. The term "omnidirection" may refer to all directions without any limitation. Accordingly, the stretchable electronic unit may be elastically compressible or extensible in all directions with respect to the pressure force applied on the stretchable electronic unit due to the deformation of the energy storage system.

In an example, the communication element comprises a wireless communication means and is configured to broadcast data generated by the stretchable electronic unit to the processing element. The wireless communication means may comprise the long range communication means such as LTE, 5G or the short range communication means such as Wi-Fi, Bluetooth, NFC, etc. The wireless communication means may also operate in an ultrasound region due to efficient, cost effective and packaging effective reasons. Communication via infrared signals are also applicable thereupon. Accordingly, the processing element, data storage element and/or the control unit of the energy storage system may not need to be directly arranged at the energy storage system.

The communication element may allow data transfer via the internet of things (IoT) technology to the processing element. The communication element may be also configured to transfer data generated by the stretchable electronic unit to a server system and/or a cloud system to collect data for evaluating and predicting a state of the energy storage system. Accordingly, the energy storage system may be monitored in real-time and manufactured compactly without need for large RAM/working memory. Aligned with the IoT technology, the set-up presented herewith allows for over the air (OTA) updates of the software advantageous for battery health and its efficiency.

Antenna(s) for wireless operation may also be printed during manufacturing similar to deposition of SoC processing element on the soft, conformable, stretchable electronic unit. The antenna(s) may also be additional amendments added up later in manufacturing process.

In an example, the stretchable electronic unit is configured to generate data based on temperature of the energy storage system. Preferably, the stretchable electronic unit may be configured to monitor not only the pressure force but also temperature of the energy storage system or energy storage cells. Accordingly, a simultaneous monitoring of thermal changes of the energy storage system may be available to optimize performance of the energy storage system and to avoid any hazards or even explosion due to thermal runaway. The temperature measurements by the stretchable electronic unit may be logged as a cumulative temperature, which may allow predicting, for instance, a state of health of the energy storage system. The system as disclosed has also offline processing capabilities via described SoC processing element without utilizing a wireless communication.

In an example, the stretchable electronic unit is configured to generate data based on a chemical composition inside the energy storage system. The conductive material of the stretchable electronic unit may be further configured to detect the chemical composition of vicinity inside the energy storage system. The measured chemical composition may be transferred to the processing element via the communication element and the processing element may assess if any change of the chemical composition is eminent.

In an example, the processing element is configured to determine a state of health of the energy storage system based on data received from the stretchable electronic unit. Based on the strain/deformation data and the temperature data of the energy storage cells generated by the stretchable electronic unit, the processing element may be able to assess a current condition, i.e. a state of the health of the energy storage system compared to its ideal conditions. The processing element may be further configured to send the measured state of health of the energy storage system to control or optimize operation conditions of the energy storage system.

The processing element may be further configured to send the measured state of health of the energy storage system to control or optimize operation conditions of the energy storage system for failure mode operation of the vehicle.

In an example, the processing element may be configured to determine a deformation degree of the energy storage cells and/or the energy storage system by comparing a change of the strain and/or pressure force data generated by the stretchable electronic unit. For instance, the processing element may compare strain data at a manufacturing stage of the energy storage system or generated in a previous use with the strain data generated in real-time during current use. The strain measurements and/or deformation measurements by the stretchable electronic unit may be logged as a cumulative mechanical change, which may allow predicting, for instance, a state of health of the energy storage system. Hence, any risky situations may be avoided and performance of the energy storage system may be optimized according to the measurement of the stretchable electronic unit.

In an example, the processing element may be configured to determine a deformation rate of the energy storage cells and/or the energy storage system by comparing a rate of change of the strain and/or pressure force data generated by the stretchable electronic unit. For instance, the processing element may compare rate of strain data at a manufacturing stage of the energy storage system or generated in a previous use with the rate of strain data generated in real-time during current use. The rate of strain measurements and/or deformation measurements by the stretchable electronic unit may be logged as a cumulative mechanical change, which may allow predicting, for instance, a state of health of the energy storage system. Hence, any risky situations may be avoided and performance of the energy storage system may be optimized according to the measurement of the stretchable electronic unit.

In an example, the monitoring system further comprises a control unit. The control unit is configured to log rate of change of the temperature, the chemical composition and/or the state of health in the energy storage system based on data generated by the stretchable electronic unit. Hence, the control unit may monitor the cumulative changes of the temperature, the chemical composition and/or the state of health in the energy storage system. Accordingly, the control unit may be able to predict precisely the current state of the energy storage system. Hence, any risky situations may be avoided and performance of the energy storage system may be optimized according to the measurement of the stretchable electronic unit.

In an example, the control unit may be further configured to be embedded in the stretchable electronic unit.

In an example, the control unit may be configured to control heat in the energy storage system based on data generated by the stretchable electronic unit if the temperature of the energy storage system exceeds a temperature threshold. The control unit may be configured to receive temperature data directly from the stretchable electronic unit via the communication element and/or from the processing element. The control unit may be integrated in a battery management system (BMS) or at least connected physically/wirelessly to the BMS. The control unit may comprise a capacity for real time computations and allocation for data repository.

The temperature threshold may be an upper temperature limit, below which the energy storage system may operate safely. The control unit may control the temperature of the energy storage system based on temperature measurements by the stretchable electronic unit. The control unit may determine if the received temperature data may exceed a predefined temperature threshold. The temperature data may be single temperature data or cumulative temperature data. In case the temperature of the energy storage system exceeds the predefined temperature threshold, the control unit may communicate with a cooling system, for instance a thermal management system of the vehicle, to reduce the temperature of the energy storage system. Hence, any risky situations may be avoided and performance of the energy storage system may be optimized.

The control unit may control the rate of temperature change of the energy storage system based on temperature measurements by the stretchable electronic unit. The control unit may determine if the received rate of temperature change data may exceed a predefined rate of temperature change threshold. In case the rate of temperature change of the energy storage system exceeds the predefined rate of temperature change threshold, the control unit may communicate with a cooling system, for instance a thermal management system of the vehicle, to reduce the rate of temperature change of the energy storage system. Alternatively put the system into failure mod and limit further damage. Hence, any risky situations may be avoided and performance of the energy storage system may be optimized.

The control unit may control the instantaneous magnitudes and/or rate of change in electric and magnetic fields based on measurements by the SoC based stretchable electronic unit. When a predetermined band is trespassed for the amplitudes and/or frequencies for these magnitudes, the system will take preventive measures for SOH, send a message wirelessly, trigger OEM action via cloud and activate failure mode operation.

The control unit may be further configured to generate a warning signal if the deformation degree of the energy storage system exceeds a predefined deformation threshold. Additionally or alternatively, the control unit may be also configured to generate a warning signal if the temperature of the energy storage system exceeds the temperature threshold. The control unit may receive information on the deformation and/or the temperature of the energy storage cells from the processing element, preferably by the wireless communication means. According to the received information, the control unit may generate the warning signal to a user via a user interface device such that the user may cope with the current state of the energy storage system correctly. The user interface device may be for instance, a computer, a mobile phone, Android/I-phone app, a display on the charging station and/or a display in a vehicle to be charged. Alternatively, the warning signal/failure code can be transmitted to the OEM to trigger proper action.

In an example, the control unit is further configured to determine a charging/discharging rate of the energy storage system. The control unit may communicate with the battery management system to optimize the charging speed of the energy storage system based on the deformation degree and/or thermal load, i.e. temperature of the energy storage system. In other words, the control unit may determine an optimum charging speed based on the state of the health of the energy storage system.

In an example, the energy storage cells has a pouch shape. The pouch-type cells may provide a high degree of integration by stacking a plurality of the cells with a compact size and a small weight. The energy storage cells may be, for instance, lithium ion cells. However, such pouch shaped cells may be swelled or bulged if an electrolyte of the cells is decomposed due to overheating, thereby generating gas inside the cell. Further, the pouch shaped cells may be also swelled if the cells are deep discharged. The stretchable electronic unit may detect the deformation, particularly swelling of the energy storage cells based on strain applied on the stretchable electronic unit to avoid any hazards or risky situations.

However, the shape of the energy storage cells may be not limited to a specific form. Alternatively, the energy storage cells may also have a prism shape, a cylindrical shape or the like, bipolar stack, or other solid state formats. The monitoring system according to the present disclosure may be arranged at any type or shape of the energy storage cells and configured to generate data relating the state of health of the energy storage system, which may be transferred via the wireless communication means. Accordingly, the energy storage system may be manufactured compactly and the monitoring and controlling of the energy storage system may be performed remotely.

According to the present disclosure an energy storage system is presented. The energy storage system comprises a plurality of energy storage cells and the monitoring system as described above. The energy storage system may be configured for storing and providing energy. The energy storage system may be a high voltage energy storage system and configured, for instance to supply energy to propel the vehicle. The energy storage system may be configured for home non-mobile usage.

The wireless communication system of the SoC based soft, conformable, stretchable electronic unit may comprise amendment to protect data and assure its cybersecure operation. The wired access of the SoC based soft, conformable, stretchable electronic unit may comprise amendment to protect data and assure its cybersecure operation.

The energy storage system may comprise one or more energy storage modules. The energy storage module may comprise a plurality of rechargeable energy storage cells, which may be electrically connected in series or parallel. The monitoring system may be arranged at one or more individual energy storage cells, energy storage modules and/or an energy storage system, configured to generate data based on stress, strain and/or thermal load thereon and transfer data via a wireless communication means to the processing element and/or the control unit.

According to the present disclosure, a vehicle is presented. The vehicle comprises an energy storage system as described above. In an example, the vehicle is a battery electric vehicle or a hybrid electric vehicle for ground, air or water such as electric car, rail vehicle, electric watercraft and/or electric aircraft, as well as an application for home electric energy storage. The electric vehicles may be powered by a high voltage energy storage system which may comprise a plurality of energy storage cells. In case of any malfunction, such cells may be swelled. By utilizing the energy storage system according to the present disclosure, reliable real-time monitoring of deformation and/or aging of the energy storage system may be performed, thereby any hazards or risky situations may be prevented.

According to the present disclosure, a manufacturing method for an energy storage system for monitoring energy storage cell condition is presented. The manufacturing method comprises
providing at least one stretchable electronic unit,
providing a communication element, and
integrating a communication element in the first stretchable electronic unit.

The stretchable electronic unit is arrangeable at least at one of the energy storage cells. The stretchable electronic unit is configured to generate data based on strain applied on the stretchable electronic unit. The communication element is configured to transfer data generated by the stretchable electronic unit.

It should be noted that the above embodiments may be combined with each other irrespective of the aspect involved. Accordingly, the method may be combined with structural features and, likewise, the system may be combined with features described above with regard to the method.

These and other aspects of the present embodiments will become apparent from and elucidated with reference to the embodiments described hereinafter.

BRIEF DESCRIPTION OF DRAWINGS

Exemplary embodiments will be described in the following with reference to the following drawing.

FIG. 1 shows schematically and exemplarily an embodiment of an energy storage system comprising a monitoring system according to the present disclosure.

DESCRIPTION OF EMBODIMENTS

FIG. 1 shows an energy storage system 100, which may be arranged in an electric vehicle such as a battery electric vehicle or a hybrid electric vehicle. The energy storage system 100 may be a high voltage energy storage system and supplies energy to propel the vehicle. The energy storage system 100 comprises a plurality of energy storage cells 20 and a monitoring system 10 for the energy storage system 100. The energy storage cells 20 are pouch shaped cells and stacked next to each other. Alternatively, the energy storage cells 20 may have a different shape, such as a prism shape or cylindrical shape and they may be also arranged spaced apart.

The monitoring system 10 comprises at least one stretchable electronic unit 30 and a communication element 32. The stretchable electronic unit 30 is arranged at least at one of the energy storage cells 20. The stretchable electronic unit 30 may be attached directly to one or more energy storage cells 20 and/or mounted at a packaging element of the energy storage system 100. The stretchable electronic unit 30 is configured to monitor swelling and/or contraction of the energy storage system 100 and generate data based on strain applied on the stretchable electronic unit 30. The monitoring system 10 may, however, comprise several stretchable electronic units 30, which may be arranged at several energy storage cells 20 and/or several surfaces of the energy storage system 100.

The stretchable electronic unit 30 comprises a conductive material 31 and a stretchable sheet 33, wherein the conductive material 31 is printed on the stretchable sheet 33. Accordingly, the stretchable electronic unit 30 may form a system-on-film. The conductive material 31 may be selected from the group consisting of carbon, conducting metal family of the periodic table, oxides, sulfides, conductive polymers. The stretchable sheet 33 is formed as a very thin layer and comprises an elastic and stretchable material or a fabric of a conductor. The stretchable electronic unit 30 is compressible or extensible in all directions, i.e. omnidirectionally, and configured to detect deformation of the energy storage system 100 by measuring a distance change and/or a capacitance change of the conductive material 31.

The stretchable electronic unit 30 is further configured to generate data based on temperature of the energy storage system 100. The stretchable electronic unit 30 is also configured to generate data based on a chemical composition inside the energy storage system 100.

The stretchable electronic unit 30 is further configured to generate data based on rate of changes in the energy storage system 100.

The communication element 32 is integrated in the stretchable electronic unit 30 and configured to transfer data generated by the stretchable electronic unit 30. The communication element 32 comprises a wireless communication means and it is configured to broadcast data generated by the stretchable electronic unit 30 to a processing element 50 and/or a control unit 40. The wireless communication means may comprise the long range communication means such as LTE, 5G, or the short range communication means such as Wi-Fi, Bluetooth, NFC, etc. Accordingly, the processing element and/or the control unit 40 of the energy storage system 100 may not need to be directly attached to the energy storage system 100.

The communication element 32 may allow data transfer via the internet of things (IoT) technology to the processing element. The communication element 32 may be also configured to transfer data generated by the stretchable electronic unit 30 to a server system and/or a cloud system to collect data for evaluating and predicting a state of the energy storage system 100. Accordingly, the energy storage system 100 may be monitored in real-time and manufactured compactly.

The communication element 32 may be powered from photovoltaic cells or other arrangement integrated therein for energy harvesting for stand-alone operation.

The monitoring system 10 further comprises the processing element 50. The processing element 50 is connected to the stretchable electronic unit 30 and configured to parse data generated by the stretchable electronic unit 30. The processing element 50 is configured to receive data from the stretchable electronic unit 30 via the communication element 32. Accordingly, the processing element 50 may be arranged outside the energy storage system 100 independently of an arrangement of the energy storage cells 20. Based on the obtained data, the processing element 50 may analyse, for instance a deformation degree of the energy storage cells 20 and/or the energy storage module.

The processing element 50 is configured to determine a state of health of the energy storage system 100 based on data received from the stretchable electronic unit 30. Based on the strain/deformation data and the temperature data of the energy storage cells 20 generated by the stretchable electronic unit 30, the processing element 50 may be able to assess a current condition, i.e. a state of the health of the energy storage system 100 compared to its ideal conditions.

The monitoring system 10 further comprises the control unit 40. The control unit 40 is configured to control heat in the energy storage system 100 based on data generated by the stretchable electronic unit 30 if the temperature of the energy storage system 100 exceeds a temperature threshold.

The control unit 40 is configured to receive temperature data directly from the stretchable electronic unit 30 via the communication element 32 and/or from the processing element 50. The control unit 40 may be integrated in a battery management system (BMS) or at least connected to the BMS. The control unit 40 may comprise a capacity for real time computations and data repository.

The control unit 40 is further configured to determine a charging/discharging rate of the energy storage system 100. The control unit 40 may communicate with the battery management system to optimize the charging speed of the energy storage system 100 based on the deformation degree and/or thermal load, i.e. temperature of the energy storage system 100. In other words, the control unit 40 may determine an optimum charging speed based on the state of the health of the energy storage system 100.

It has to be noted that embodiments of the disclosure are described with reference to different subject matters. In particular, some embodiments are described with reference to method type claims whereas other embodiments are described with reference to the device type claims. However, a person skilled in the art will gather from the above and the following description that, unless otherwise notified, in addition to any combination of features belonging to one type of subject matter also any combination between features relating to different subject matters is considered to be disclosed with this application. However, all features can be combined providing synergetic effects that are more than the simple summation of the features.

While the disclosure has been illustrated and described in detail in the drawings and description, such illustration and description are to be considered illustrative or exemplary and not restrictive. The disclosure is not limited to the disclosed embodiments. Other variations to the disclosed embodiments can be understood and effected by those skilled in the art in practicing a claimed disclosure, from a study of the drawings, the disclosure, and the dependent claims.

In the claims, the word "comprising" does not exclude other elements or steps, and the indefinite article "a" or "an" does not exclude a plurality. A single processor or other unit may fulfil the functions of several items re-cited in the claims. The mere fact that certain measures are re-cited in mutually different dependent claims does not indicate that a combination of these measures cannot be used to advantage. Any reference signs in the claims should not be construed as limiting the scope.

The invention claimed is:

1. A monitoring system for an energy storage system comprising a plurality of energy storage cells, the monitoring system comprising:
   at least one stretchable electronic unit,
   wherein a stretchable electronic unit of the at least one stretchable electronic unit comprises:
      a processing element; and
      a communication element;
   wherein the stretchable electronic unit is:
      arrangeable at least at one of the plurality of energy storage cells;
      configured to generate data based on:
         strain applied on the stretchable electronic unit, and
         a chemical composition inside the energy storage system;
   and
   wherein the communication element is configured to transfer the data generated by the stretchable electronic unit.

2. The monitoring system of claim 1, wherein the stretchable electronic unit further comprises a conductive material and at least one of a stretchable sheet or a conductive fabric, and wherein the conductive material is printed on the stretchable sheet.

3. The monitoring system of claim 1, wherein the stretchable electronic unit is attachable at a surface of the at least one of the plurality of energy storage cells.

4. The monitoring system of claim 1, wherein the processing element is configured to parse the data generated by the stretchable electronic unit.

5. The monitoring system of claim 1, wherein the stretchable electronic unit is attachable stretchable omnidirectionally.

6. The monitoring system of claim 1, wherein the communication element comprises a wireless communication means and is configured to broadcast the data generated by the stretchable electronic unit to the processing element.

7. The monitoring system of claim 1, wherein the stretchable electronic unit is configured to generate the data based further on temperature of the energy storage system.

8. The monitoring system of claim 1, wherein the energy storage cells has a pouch shape, a prism shape or a cylindrical shape.

9. The monitoring system of claim 1, wherein the stretchable electronic unit is configured to generate the data based further on at least one of an electrical field magnitude or a magnetic field magnitude in a vicinity of the energy storage system.

10. The monitoring system of claim 1, wherein the stretchable electronic unit is configured to generate the data based further on at least one of capacitance or inductance of the energy storage system.

11. The monitoring system of claim 1, wherein the processing element is configured to determine a state of health of the energy storage system based on the data generated by the stretchable electronic unit.

12. The monitoring system of claim 11, further comprising a control unit configured to log rate of change of at least one of temperature, the chemical composition, or the state of health in the energy storage system based on the data generated by the stretchable electronic unit.

13. The monitoring system of claim 12, wherein the control unit is further configured to determine a charging rate or a discharging rate of the energy storage system based on the logged rate of change.

14. A vehicle comprising:
   an energy storage system, the energy storage system comprising:
      a plurality of energy storage cells; and
      a monitoring system comprising:
         at least one stretchable electronic unit,
         wherein a stretchable electronic unit of the at least one stretchable electronic unit comprises:
            a processing element; and
            a communication element;
         wherein the stretchable electronic unit is:
            arrangeable at least at one of the plurality of energy storage cells;
            configured to generate data based on:
               strain applied on the stretchable electronic unit, and capacitance and inductance of the energy storage system; and wherein the communication element is configured to transfer the data generated by the stretchable electronic unit; and wherein the vehicle is a battery electric vehicle or a hybrid electric vehicle, and wherein the battery electric vehicle or the hybrid electric vehicle is for ground, air or water.

15. An energy storage system comprising:
a plurality of energy storage cells; and
a monitoring system comprising:
    at least one stretchable electronic unit,
    wherein a stretchable electronic unit of the at least one stretchable electronic unit comprises:
        a processing element; and
        a communication element;
        wherein the stretchable electronic unit is:
            arrangeable at least at one of the plurality of energy storage cells;
            configured to generate data based on:
                strain applied on the stretchable electronic unit, and
                an electrical field magnitude and a magnetic field magnitude in a vicinity of the energy storage system; and
            wherein the communication element is configured to transfer the data generated by the stretchable electronic unit.

16. The energy storage system of claim 15, wherein the stretchable electronic unit is configured to generate the data based further on temperature of the energy storage system.

17. The energy storage system of claim 15, wherein the stretchable electronic unit is configured to generate the data based further on a chemical composition inside the energy storage system.

18. The energy storage system of claim 15, wherein the stretchable electronic unit is configured to generate the data based further on at least one of capacitance or inductance of the energy storage system.

19. The energy storage system of claim 15, wherein the processing element is configured to determine a state of health of the energy storage system based on the data generated by the stretchable electronic unit.

20. A manufacturing method for a monitoring system for an energy storage system comprising a plurality of energy storage cells, the manufacturing method comprising:
    providing at least one stretchable electronic unit;
    providing a communication element; and
    integrating the communication element in the stretchable electronic unit;
    the stretchable electronic unit being arrangeable at least at one of the energy storage cells;
    the stretchable electronic unit being configured to generate data based on:
        strain applied on the stretchable electronic unit, and
        a chemical composition inside the energy storage system; and
    the communication element being configured to transfer data generated by the stretchable electronic unit.

* * * * *